United States Patent
Sakamoto et al.

(10) Patent No.: US 7,211,868 B2
(45) Date of Patent: May 1, 2007

(54) PROTECTION CIRCUIT DEVICE USING MOSFETS AND A METHOD OF MANUFACTURING THE SAME

(75) Inventors: Noriaki Sakamoto, Gunma (JP); Yoshiyuki Kobayashi, Gunma (JP); Hirokazu Fukuda, Gunma (JP); Hiroki Etou, Gunma (JP); Kouji Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 185 days.

(21) Appl. No.: 09/809,856

(22) Filed: Mar. 16, 2001

(65) Prior Publication Data

US 2002/0053744 A1 May 9, 2002

(30) Foreign Application Priority Data

Sep. 4, 2000 (JP) .................... P. 2000-266709

(51) Int. Cl.
*H01L 23/62* (2006.01)
(52) U.S. Cl. .............. 257/360; 257/355; 257/356; 257/357; 257/358; 257/359; 257/361; 257/341
(58) Field of Classification Search ......... 257/173, 257/341, 342, 355–363, 659, 660, 673, 690, 257/692, 734, 329; 438/259, 270, 588, 589
See application file for complete search history.

(56) References Cited

U.S. PATENT DOCUMENTS

| 4,889,962 A | 12/1989 | Hagner |
| 5,179,032 A | 1/1993 | Quigg |
| 5,408,121 A * | 4/1995 | Nakamura et al. .......... 257/433 |
| 5,477,065 A * | 12/1995 | Nakagawa et al. ......... 257/146 |
| 5,869,903 A * | 2/1999 | Nakatani et al. ............ 257/777 |
| 5,939,753 A * | 8/1999 | Ma et al. ..................... 257/360 |
| 6,046,071 A | 4/2000 | Sawai et al. |
| 6,191,367 B1 | 2/2001 | Hayashi |
| 6,238,952 B1 * | 5/2001 | Lin ............................ 438/110 |
| 6,269,011 B1 * | 7/2001 | Ohshima ..................... 257/355 |
| 6,323,518 B1 * | 11/2001 | Sakamoto et al. .......... 257/355 |
| 6,396,138 B1 * | 5/2002 | Cheah ......................... 257/692 |
| 6,436,734 B1 | 8/2002 | Lin |
| 6,548,328 B1 | 4/2003 | Sakamoto et al. |
| 2005/0029588 A1 | 2/2005 | Sakamoto et al. |

FOREIGN PATENT DOCUMENTS

| DE | 19607974 | 9/1996 | |
| EP | 0717497 A2 | 6/1996 | |
| JP | 60-107866 * | 6/1985 | .................... 29/78 |
| JP | 63-311418 | 12/1988 | |
| JP | 10-012282 | 1/1998 | |
| JP | 10-117443 | 5/1998 | |

* cited by examiner

*Primary Examiner*—Steven Loke
*Assistant Examiner*—Quang Vu
(74) *Attorney, Agent, or Firm*—Fish & Richardson P.C.

(57) ABSTRACT

A protection circuit device using a MOSFET has a plural of conductive paths separated electrically, a MOSFET chip integrating two power MOSFETs in one chip where a gate electrode and a source electrode are fixed on the desired conductive path, conductive material provided on a common drain electrode of the MOSFET, and insulating resin covering said MOSFET and supporting said conductive path in one body. Removing a drawing-around of the common drain electrode and fixing the source electrode directly on the conductive path, low ON-state resistance is realized.

11 Claims, 17 Drawing Sheets

FIG.18

| | | frame | pre-form | connection configuration | electrode on the chip surface | Rds(on), V$_{GS}$=4V (mΩ) | remarks |
|---|---|---|---|---|---|---|---|
| conventional | A | cupper | solder | Au wire:4 short wires | Al | 13.43 | 4 short wires (source side) |
| | B | cupper | solder | Au wire:conventional | Al | 12.10 | 2 long and 2 short wires (source side) |
| present invention | C | cupper | solder | Cu/solder | Au bump | 8.67 | wireless (reference of wireless configuration) |
| | D | cupper | silver paste | Cu/Ag paste | Au bump | 8.74 | effect of the Ag paste |

Material Characteristics (volume resistance coefficient ρ)

| frame (Cu) | $5.74 \times 10^{-6}$ Ω·cm |
|---|---|
| Au wire | $2.4 \times 10^{-6}$ Ω·cm |
| solder (Pb/5Sn/2.5Ag) | $1.95 \times 10^{-5}$ Ω·cm |
| Ag paste | $1.0 \times 10^{-4}$ Ω·cm |

PROTECTION CIRCUIT DEVICE USING MOSFETS AND A METHOD OF MANUFACTURING THE SAME

BACKGROUND OF THE INVENTION

1. Field of the Invention

The present invention relates a protection circuit device using MOSFET and method of manufacturing the same, particularly enabling to build in a secondary battery and carrying out battery management.

2. Description of the Related Art

As the spread of pocketable terminal, small lithium ion battery having large capacity is desired. A protection circuit device carrying out battery management of charge-discharge of the lithium ion battery must be smaller and sufficiently resist to short of load. As such protection circuit device is built in vessel of lithium ion battery, miniaturization is required, and freely using COB (Chip on Board) technique using many chip parts meets require of miniaturization. However on the other hand, as switching element is connected to lithium ion battery in series, it is needed to make ON-state resistance of the switching element extremely small. This is indispensable factor to lengthen talking time or stand-by time in pocket telephone.

A protection circuit carrying out concrete battery management is shown in FIG. 19. Two power MOSFETs Q1 and Q2 are connected to a lithium ion battery LiB in series to detect voltage of the lithium ion battery LiB with a control IC. The detection carries out on-off control of the two power MOSFETs Q1 and Q2, and the lithium ion battery LiB is protected from over-charge, over-discharge, or load short. The power MOSFETs Q1 and Q2 connect drain electrodes D in common, source electrodes S are arranged respectively at both ends thereof, and gate electrode G of each MOSFETs is connected to the control IC.

At charge, a power source is connected to ends of the circuit, and charge current is applied to the lithium ion battery LiB to arrow direction so as to charge. When the lithium ion battery LiB becomes over-charge state, voltage is detected by the control IC, gate voltage of the power MOSFET Q2 becomes L (low level) from H (high level), and the power MOSFET Q2 becomes off and cuts the circuit so as to protect the lithium ion battery LiB.

At discharge, both ends of the circuit are connected to a load and operation of a pocketable terminal till designated voltage. However when the lithium ion battery LiB becomes over-discharge state, voltage is detected by the control IC, gate voltage of the power MOSFET Q1 becomes L from H, and the power MOSFET Q1 becomes off and cuts the circuit so as to protect the lithium ion battery LiB.

Moreover at load shot or over-current, much current flows the power MOSFETs Q1 and Q2 so that voltage of both ends of the power MOSFETs Q1 and Q2 suddenly rises. Because of that, the voltage is detected by the control IC, and similarly at discharge the power MOSFET Q1 becomes off and cuts the circuit so as to protect the lithium ion battery LiB. However as large current flows at short time till the protection circuit operates, it is required that peak drain rash current flows much to the power MOSFETs Q1 and Q2.

As two N-channel type power MOSFETs Q1 and Q2 are connected to the lithium ion battery LiB in series in the protection circuit, low-ON-state resistance ($R_{DS(on)}$) of power MOSFETs Q1 and Q2 is most required point. Therefore development raising sell density by fine pitch machining at manufacturing the chip is driven forward.

In detail, although sell density was 7.4 million per a square inch and ON-state resistance was 17 mΩ in planer structure that a channel is formed on a semiconductor substrate surface, at first generation of trench structure forming a channel at side face of trench, sell density is extremely improved in 25 million per a square inch and ON-state resistance is decreased in 27 mΩ. Further in second generation of the trench structure, sell density is 72 million per a square inch and ON-state resistance is decreased in 12 mΩ. However making fine has limit, and there is a limit to decrease ON-state resistance extremely.

FIG. 20 is a plan view describing a protection circuit device mounting such a power MOSFET improved in sell density. Although circuit parts shown in FIG. 19 are mounted actually, the parts are not shown all in the figure. A conductive path 2 comprising copper foil is formed on both face of an insulating board 1, and has multilayer interconnection where the conductive paths 2 of upper face and lower face of the board are connected through through-hole (not shown) at desired position. Power MOSFETs 3 and 4 are resin-molded in an external form of SOP8 for surface mounting, two terminals 5 and 5 connected to drain electrodes go out at one side, and at the opposite side, a gate terminal 7 connected to a gate electrode and a source terminal 8 connected to a source electrode go out. Symbol 9 is a control IC, symbol 10 are chip capacitors corresponding to C1 to C3 of FIG. 19, and symbol 11 are chip resisters corresponding to R1 and R2 of FIG. 19. Symbols 12 and 13 are external terminals corresponding to LP2 and LP3 of FIG. 19. The external terminals are fixed on pads 14 formed at part of the conductive path 2 by solder. Although the protection circuit device is formed in a suitable shape to put in the case of the lithium ion battery, miniaturization is the largest problem for fundamental needs.

FIG. 21 shows a section structure of the power MOSFETs 3 and 4. A frame is a pressed frame comprising NK-202 (copper 97.6%, tin 2%) as material, and a bare chip 23 of the power MOSFET is fixed with a preform material 22 comprising solder or silver paste on a header 21 of the frame. A drain electrode is formed by gold lining electrode (not shown) on lower face of the bare chip 23 of the power MOSFET, and on upper face, a gate electrode and a drain electrode are formed by deposition of Aluminum. As connected to a header 21, a drain terminal of the frame is connected to the drain electrode directly, and the gate electrode and the source electrode are electrically connected to a gate terminal 7 and a source terminal 8 by ball bonding using gold bonding wire 24. Therefore ON-state resistance of power MOSFET is influenced ON-state resistance existing in frame material, preform material, material for the bonding wire, and electrode material of the source electrode on the upper face of the chip for decreasing ON-state resistance.

FIG. 22 and FIG. 23 are plan view describing the prior art decreasing ON-state resistance devising bonding wire. FIG. 22 is a view where current capacity is improved by increasing the bonding wire 24 connecting the source electrode and the source electrode 8 to four wires. Further FIG. 22 is a view where current capacity is improved by increasing the bonding wire 24 connecting the source electrode and the source electrode 8 to four wires, two short wires and long two wires, and where resistance of the source electrode is decreased by broadening bonding portion to the source electrode.

Difference of ON-state resistance depending on the conventional mounting structure of power MOSFET is completed in FIG. 18. Sample A and Sample B are the conventional mold structure of SOP8, Sample A corresponds to the structure of FIG. 22, and Sample B corresponds to the structure of FIG. 23. These figures show, in the case that bonding wires is changed to combination of two short wires and two long wires from four short wires, decrease of ON-state resistance of 1.33 mΩ, from 13.43 mΩ to 12.10 mΩ, however changing solder to Ag paste can not decrease ON-state resistance.

However a present state is that small, light weight pocketable terminal and long life of built-in battery thereof are more strongly required. In the sate, there is a problem that useful solving means breaking down mounting structure of protection circuit device using power MOSFET, realizing low ON-state resistance, and realizing small protection circuit device using MOSFET is not found out.

SUMMARY OF THE INVENTION

The invention is carried out from the aspect of above problems.

The object of the present invention is to provide a protection circuit device using power MOSFET for realizing low ON-state resistance and reducing size of the device.

The protection circuit device using a MOSFET connects two MOSFET in series and switches said both MOSFETs. In the device, a conductive path having a desired pattern is provided on an insulating board, each gate electrode and each source electrode of a MOSFET chip integrating said both MOSFET in one chip are fixed on the desired conductive path, and conductive material is put on a common drain electrode provided at a back face of said MOSFET chip. Namely, each gate electrode and each source electrode of a MOSFET chip integrating said both MOSFET in one chip are fixed on a conductive path having a low resistance, provided outside the chip. The MOSFET chip is fixed on the conductive path by flip chip method and conductive path of common drain electrode is removed so as to realize low ON-state resistance and miaturization.

In the invention, a protection circuit device using MOSFETs the protection circuit using the MOSFET connects two MOSFET and switches said both MOSFETs with a control IC. A conductive path of a desired pattern buried in an insulating resin is provided, each gate electrode and each source electrode of a MOSFET chip integrating said both MOSFET in one chip are fixed on the desired conductive path, and conductive material is put on a common drain electrode provided at a back face of said MOSFET chip.

Removing an insulating board having supporting function, a small and thin device is realized.

In the invention, a method for manufacturing a protection circuit device using MOSFET has process providing a conductive foil and forming a conductive path by forming a thinner trench than thickness of said conductive foil on at least said conductive foil except area becoming the conductive path, process fixing each gate electrode and each source electrode of a MOSFET integrating two MOSFETs on said desired conductive path in one chip, process bonding conductive material on a common electrode of the MOSFET, process covering said MOSFET and molding with insulating resin so as to fill into said trench, and process removing said conductive foil of part of thickness where said trench is not provided. Therefore, efficient method for manufacturing a protection circuit device using a MOSFET is realized.

BRIEF DESCRIPTION OF THE DRAWINGS

FIG. 18 is a characteristic view describing characteristic of MOSFET chip of the invention and the conventional way.

DESCRIPTION OF THE PREFERRED EMBODIMENTS

The mode for carrying out the invention is described referring to FIG. 1 to FIG. 19.

Figure 1:
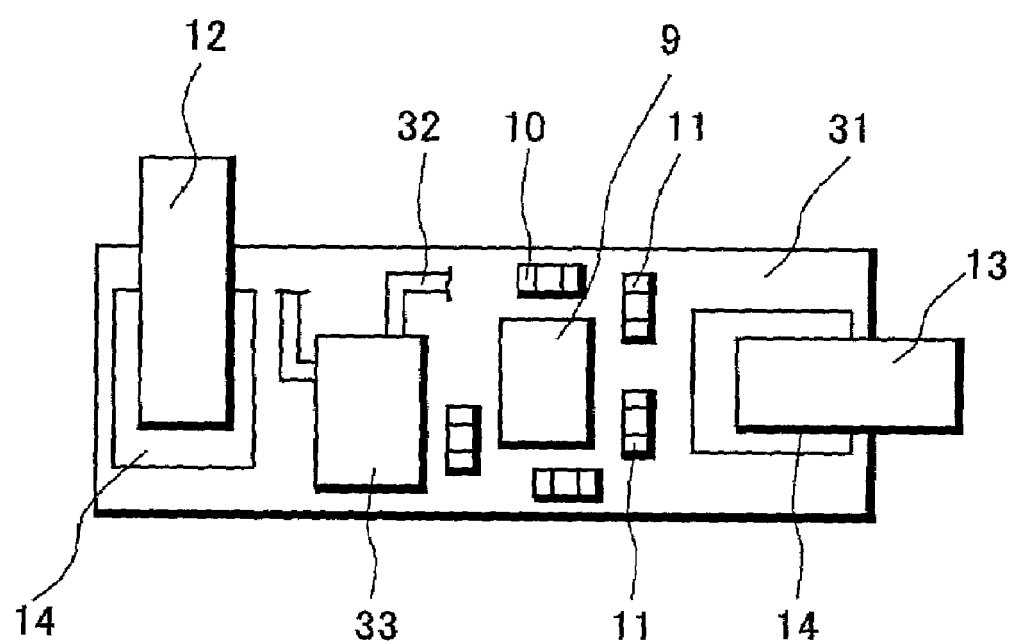
FIG. 1 is a plan view describing a protection circuit device using a MOSFET of the invention.
Figure 19:
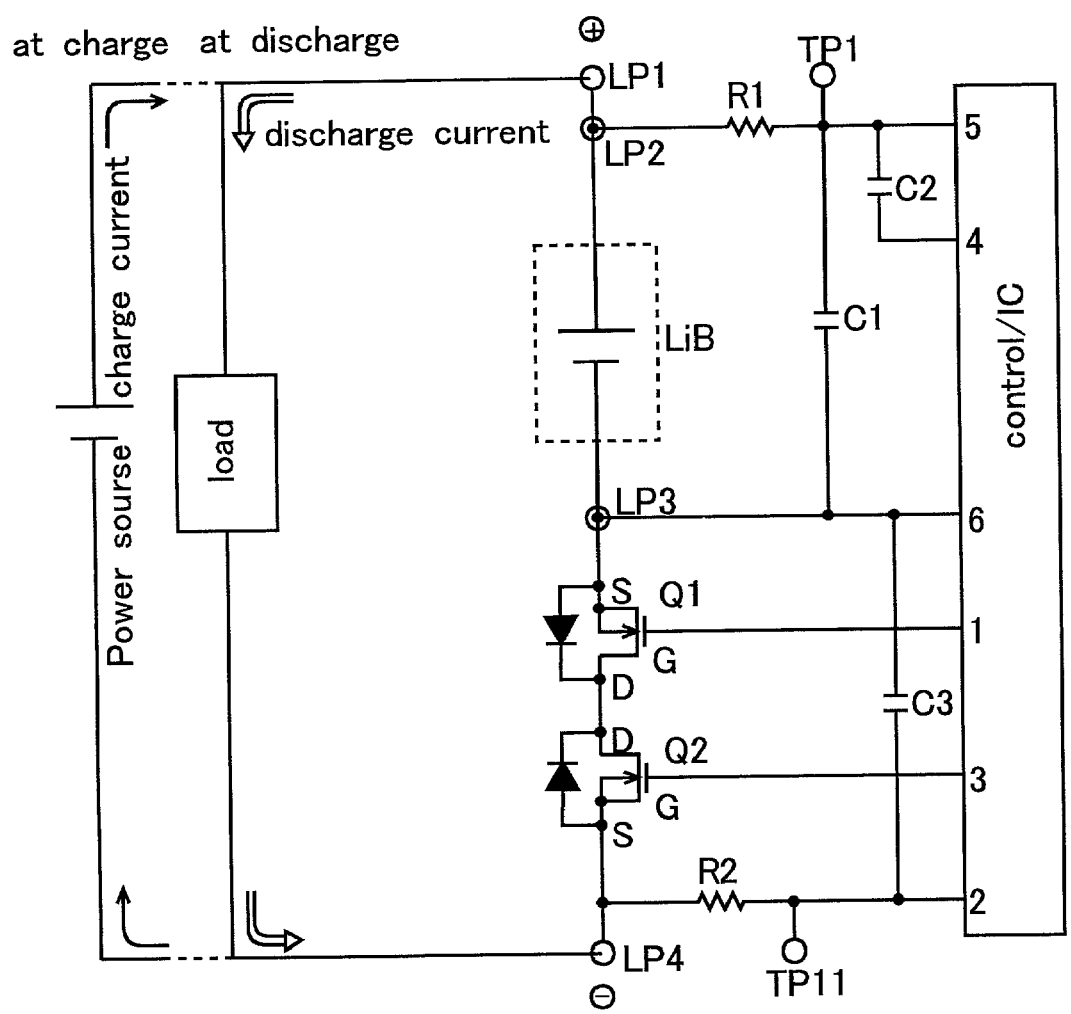
FIG. 19 is a circuit diagram of a protection circuit device using a MOSFET applied for the invention.
Figure 20:
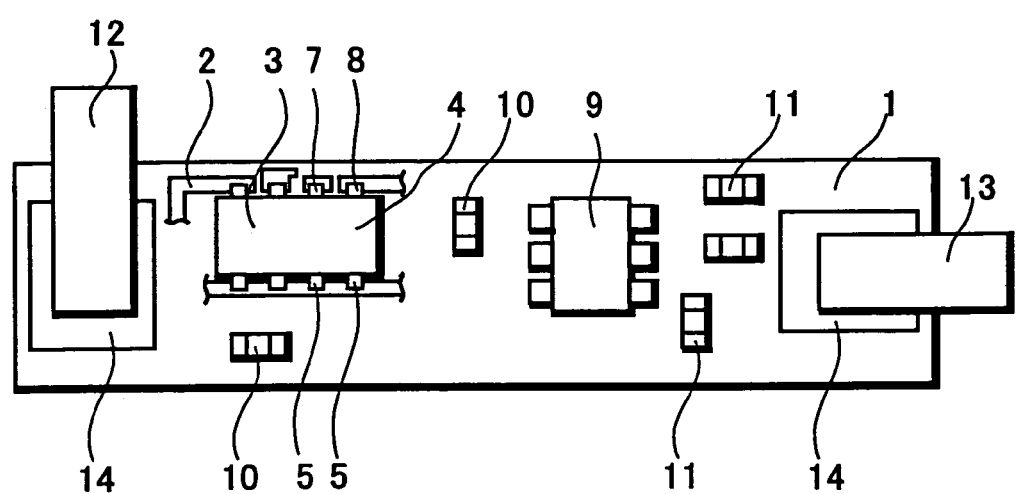
FIG. 20 is a plan view describing the conventional protection circuit device using a MOSFET.
Figure 21:
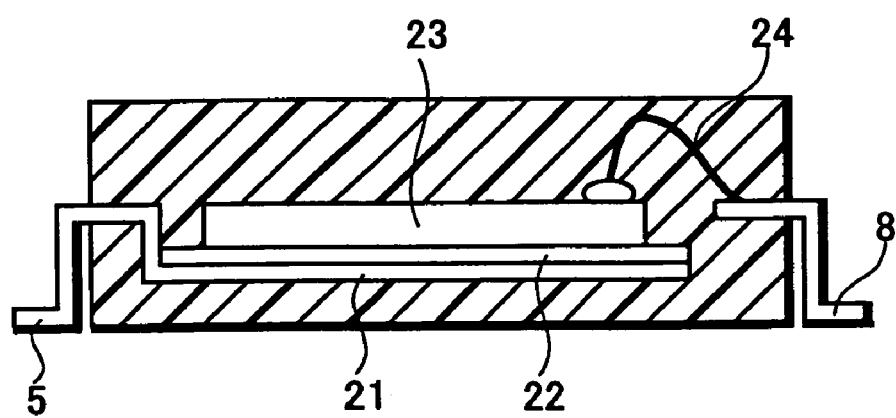
FIG. 21 is a section view describing the conventional mounting structure of MOSFET.
Figure 22:
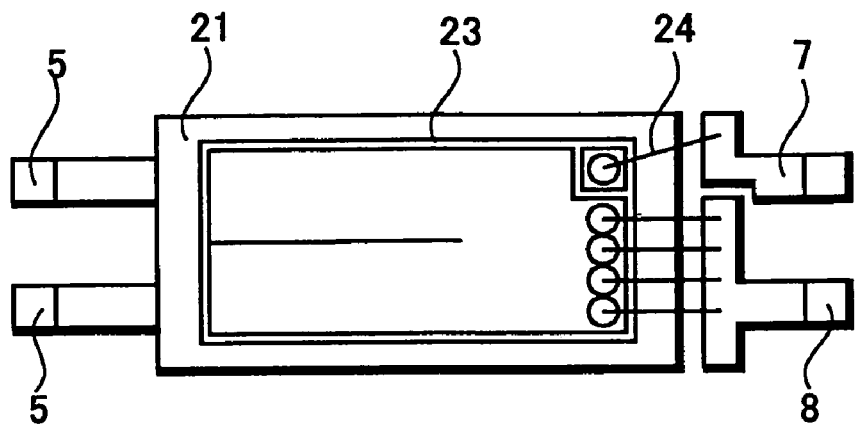
FIG. 22 is a plan view describing the conventional mounting structure of MOSFET.
Figure 23:
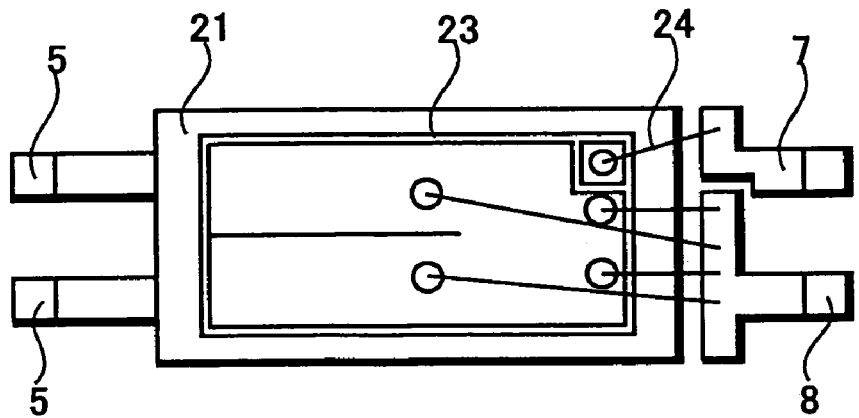
FIG. 23 is a plan view describing the conventional mounting structure of MOSFET.

FIG. 1 shows a plan view of a protection circuit device using the invention. Although circuit parts are mounted as the circuit shown in FIG. 19 is realized in the protection circuit device, the parts are not shown all in the figure. A conductive path 32 comprising copper foil is formed on both face of an insulating board 31, and has multilayer interconnection where the conductive paths 32 of upper face and lower face of the board are connected through through-hole (not shown) at desired position.

Characteristic of the invention is to mount a MOSFET chip 33 integrating power MOSFETs Q1 and Q2 of switching element in one chip with just bare chip by flip chip method.

Figure 2A:
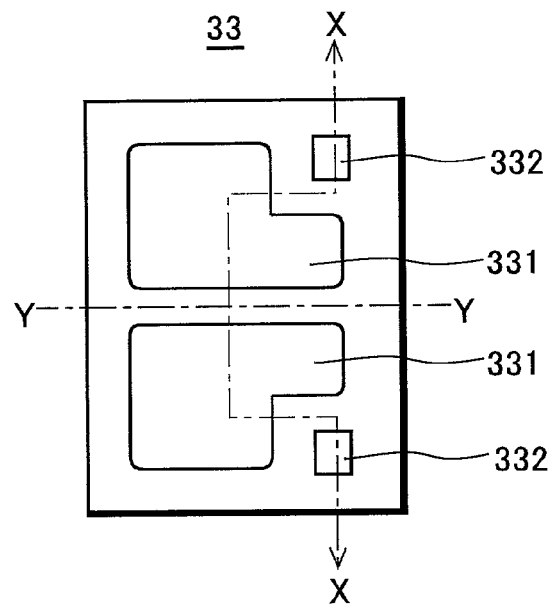
FIG. 2A is a plan view and FIG. 2B is a section view cut by X—X line of a MOSFET chip for a protection circuit device using a MOSFET of the invention.
Figure 2B:
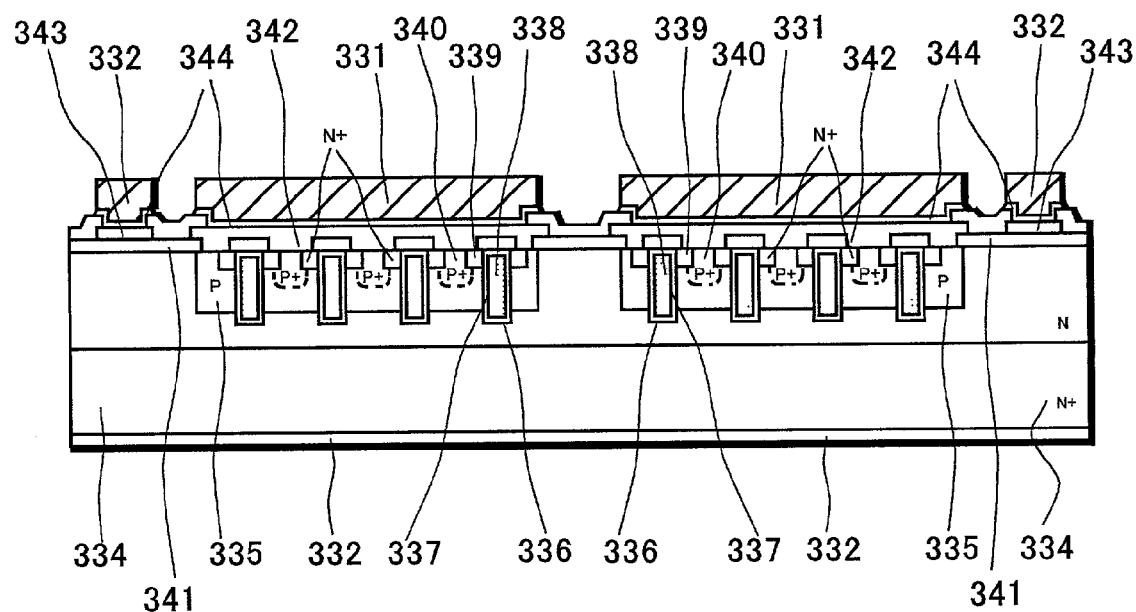

A structure of concrete structure of the MOSFET chip 33 is shown in FIG. 33. FIG. 2A is a plan view, and FIG. 2B is a section view cut by X—X line.

The MOSFET chip 33 has an $N^+/N$ semiconductor substrate 334 being drain region, a P channel region 335, a trench 336 provided passing through the channel region 335, a gate electrode 338 buried in the trench 336 through a gate oxide film 337 and comprising poly silicon, an N+ source region 339 provided adjacent to the trench 336, and P+ body region 340 forming a board diode provided adjacent to the source region 339. On an insulating film 341 of a semiconductor substrate 334, a substrate source electrode 342 contacting the source region 339 and the body region 340 and formed by aluminum-sputtering, and a substrate gate electrode 343 connected to the gate electrode 338. On the substrate source electrode 342 and the substrate gate electrode 343, a barrier metal layer 344 of Pd/Ti or Au/TiW is provided, and on the layer a source electrode 331 and a gate electrode 332 of gold bump formed by gold plating of 25 μm height. On entire back face of the semiconductor substrate 334, a drain electrode 333 is provided by deposition of Au/Cr and so on.

The source electrode 331 and the gate electrode 332 of the power MOSFETs Q1 and Q2 are arranged symmetrically with respect to center line Y—Y of the chip as clear from FIG. 2A, the source electrodes 331 are provided at most part of the semiconductor substrate 334, the gate electrodes 332 are provided symmetrically with respect to line largely separated at corner portions of the semiconductor substrate 334. This is for easy fixing to the conductive path corresponding by flip chip method.

The source electrode 331 and the gate electrode 332 may be formed with a solder electrode bonding brazing material such as solder to a conductive ball, and a source electrode 221 and a gate electrode 222 may be usual flat electrodes enabling to solder without projecting electrodes because the conductive paths 32 are electrically separated.

First mode for carrying out describing a protection circuit device using MOSFET

Figure 3:
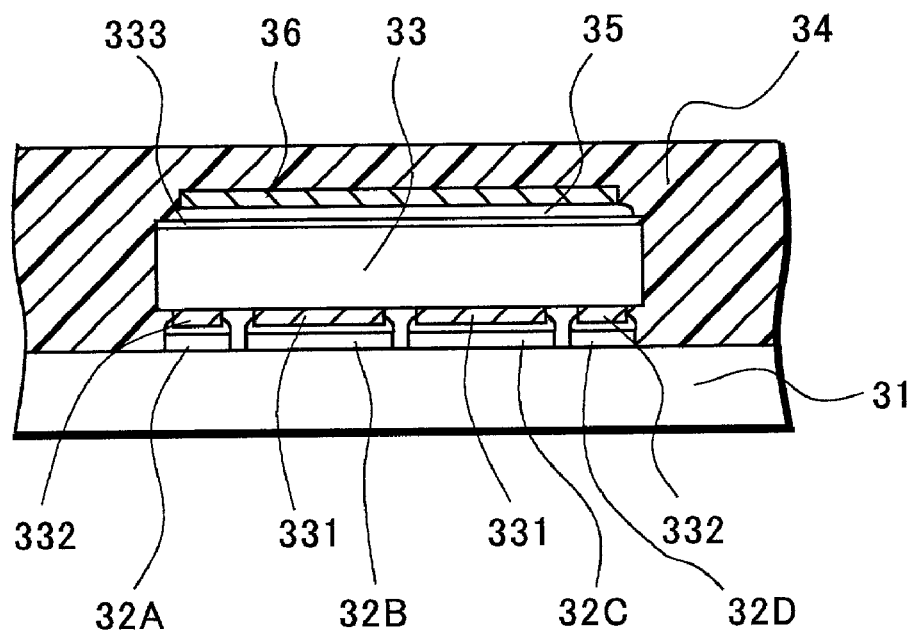
FIG. 3 is a section view describing a first mode for carrying out of a protection circuit device using a MOSFET of the invention.

First, a structure of a protection circuit device using MOSFET of the invention is described referring FIG. 3.

In FIG. 3, a mounting structure is shown. That is, a conductive path 32 formed by desired copper foil or conductive paste so that the circuit shown in FIG. 19 is realized on an insulating board 31 formed by glass epoxy board or ceramic board is provided. On the conductive path 32, MOSFET chip 33 is fixed, and at least MOSFET chip 33 is covered by said insulating resin 34.

In the mounting structure, two source electrodes 331 and two gate electrode 332 of the MOSFET chip 33 are contacted to a plural of conductive paths 32A, 32B, 32C, and 32D, and fixed by solder or the conductive paste 35. On a drain electrode 333 of the MOSFET chip 33, solder or the conductive paste 35 fixes a conductive metal plate 36 such as copper. The conductive metal plate 36 is provided in order to decrease ON-state resistance of power MOSFET Q1 and Q2 of the MOSFET chip 33 connected in series, and has an object too to improve radiation characteristic. Therefore forming by only solder or conductive paste 35 instead of the conductive metal plate 36 can achieve the object to decrease ON-state resistance.

For the insulating resin 34, thermosetting resin such as epoxy resin and thermoplastic resin such as polyimide resin and polyphenylenesulfide are used. All kinds of resin are used if they are resins hardening using a die and covering by dipping and painting.

As the MOSFET chip 33 is fixed to the conductive path 32 by flip chip method in the mounting structure, it is not need to take the drain electrode 333 of the MOSFET chip 33 out so that the structure without using bonding wire is thin and expensive.

Great characteristic of the mounting structure is to especially take conductive paths 21B and 21C out directly from the source electrode by flip chip method without bonding using bonding wire. Because of that, as clear from FIG. 18, in the invention, ON-state resistance of Sample C is 8.67 mΩ and ON-state resistance of Sample D is 8.74 mΩ. Resistance of both samples is improved about 30% comparing with ON-state resistance 12.10 mΩ of Sample B by the conventional wire bonding. At the same time, loop necessary for bonding wire is removed so as to make the insulating resin 20 thin as much as the loop.

Figure 4:
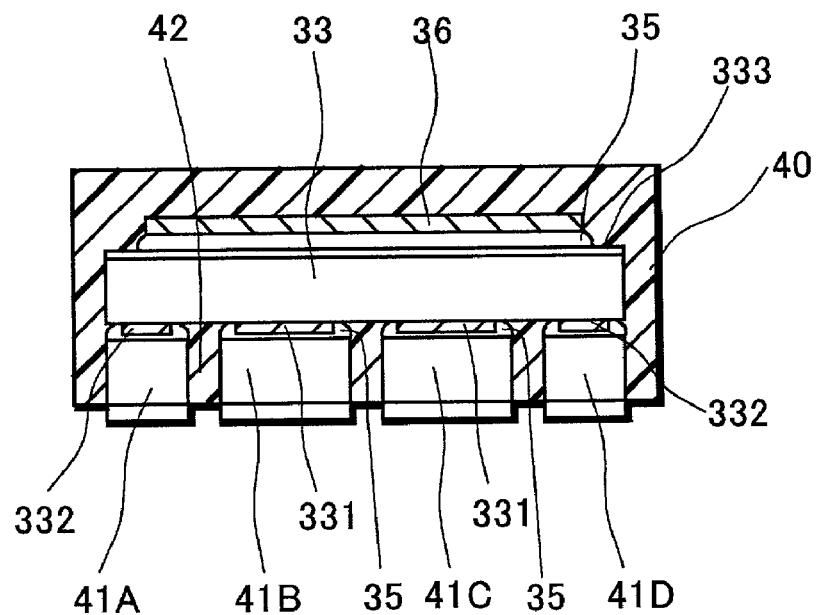
FIG. 4 is a section view describing a second mode for carrying out of a protection circuit device using a MOSFET of the invention.

Second mode for carrying out describing a protection circuit device using a MOSFET A mounting structure of the second mode for carrying out of the protecting circuit device using MOSFET of the invention is described referring FIG. 4.

FIG. 4 shows a mounting structure. That is, a conductive path 41 is buried in an insulating resin 40, on said conductive path 41 a MOSFET chip 33 is fixed, and the conductive path 41 is supported by said insulating resin 40.

The mounting structure comprises the MOSFET chip 33, a plural of conductive paths 41A, 41B, 41C, and 41D, a conductive metal plate 36, and the an insulating resin 40 burying the conductive paths 41A, 41B, 41C, and 41D. Between the conductive paths 41, a trench 42 filled with the insulating resin 40 is provided. Said conductive paths 41 are supported by the insulating resin 40.

For the insulating resin 34, thermosetting resin such as epoxy resin and thermoplastic resin such as polyimide resin and polyphenylenesulfide are used. All kinds of resin are used if they are resins hardening using a die and covering by dipping and painting.

For the conductive resin 41, a conductive foil of Cu as a main material, a conductive foil of Al as a main material, or a conductive foil comprising alloy of Fe—Ni and so on is used. Of course other conductive material is possible, especially conductive material enable to etch and evaporate by laser are desirable.

The MOSFET chip 33 where the power MOSFET Q1 and Q2 are integrated in one chip is a semiconductor bare chip having a source electrode 331 and a gate electrode 332 at front face thereof, and at entire back face, having a drain electrode 333. A concrete structure of the MOSFET chip 33 is described in FIG. 2, therefore description is omitted here In connection of MOSFET chip 33, for the source electrode 331 and the gate electrode 332 are fixed to designated conductive paths 41A, 41B, 41C, and 41D by brazing material such as solder and a conductive paste 35 such as Ag paste, at a drain electrode 333 of back face, a conductive metal plate 36 is fixed by brazing material such as solder and a conductive paste 35 such as Ag paste. The conductive metal plate 36 is provided in order to decrease on-state resistance of power MOSFET Q1 and Q2 of the MOSFET chip 33 connected in series, and has an object too to improve radiation characteristic. Therefore forming by only solder or conductive paste 35 instead of the conductive metal plate 36 can achieve the object to decrease ON-state resistance. Connection of the conductive metal plate 36 to the other conductive path 41 is not need.

In the mounting structure, as the insulating resin 40 being sealing resin supports the conductive path 41, a supporting board is not necessary. Therefore the structure consists of the conductive path 41, MOSFET chip 33, the conductive metal plate 36, and the insulating resin 40, consists of necessary minimum elements so that the structure is thin and expensive.

The mounting structure has merit that each of the conductive paths 41 is insulated by insulating resin 40 as the insulating resin 40 covers the MOSFET chip 33 and fills into said trench 42 between said conductive paths 41 so as to have function supporting in one body.

Great characteristic of the mounting structure is to especially take the conductive paths 41B and 41C out directly from the source electrode 331 by flip chip method without the conventional bonding using bonding wire. Because of that, as clear from FIG. 18, in the mounting structure of the invention, ON-state resistance of Sample C (case taking out by solder) is 8.67 mΩ and ON-state resistance of Sample D (case taking out by silver paste) is 8.74 mΩ. Resistance of both samples is improved about 30% comparing with ON-state resistance 12.10 mΩ of Sample B by the conventional wire bonding. At the same time, loop necessary for bonding wire is removed so as to make the insulating resin 40 thin as much as the loop.

In the mounting structure, front face of the insulating resin 40 filled into the trench 42 and front face of the conductive path 41 are substantially in coincidence. Because of that, at mounting the mounting structure on a printed board, the structure is automatically self-aligned as the structure can rise by surface tension of brazing material such as solder and move horizontally.

Third mode for carrying out describing a protection circuit device using MOSFET

Figure 12:
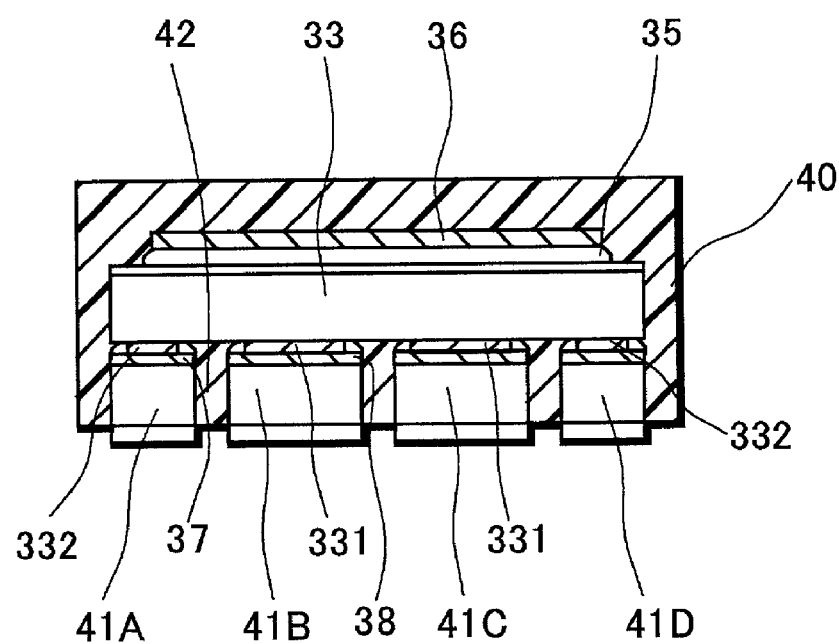
FIG. 12 is section view describing a third mode for carrying out of a method for manufacturing a protection circuit device using a MOSFET of the invention.

Next, a third mounting structure of the protection circuit device using MOSFET of the invention is described referring FIG. 12.

In the mounting structure, a conductive film 37 is formed on front face of a conductive path 41, and excepting that, the structure is substantially same as the structure of FIG. 4. Therefore the conductive film 37 is described.

First characteristic is a point that the conductive film 37 is provided to prevent bending of a conductive path or a circuit device.

Generally the mounting structure itself bends and the conductive path curves and peel off by difference of coefficient of thermal expansion between insulating resin and conductive path material (called first material hereafter). As thermal conductivity of the conductive path 41 is superior than thermal conductivity of the insulating resin 40, the conductive path 41 expands previously by temperature rise. Because of that, covering a second material smaller coefficient of thermal expansion than the first material can prevent bending and peeling off of the conductive path and bending of the mounting structure. Especially in case of using Cu for the first material, Au, Ni, or Pt is good for the second material. Coefficient of expansion of Cu is $16.7 \times 10^{-6}$, Au is $14 \times 10^{-6}$, Ni is $12.8 \times 10^{-6}$, and Pt is $8.9 \times 10^{-6}$.

Second characteristic is a point that the structure has anchor effect by the second material. Eaves are formed by the second material, further as the eaves 38 fixing to the conductive path 41 are buried in the insulating resin 40, anchor effect appears so as to prevent the conductive path 41 removing.

First mode for carrying out describing a method for manufacturing a protection circuit device using MOSFET Next, first method for manufacturing a protection circuit device using MOSFET is described referring FIG. 5 to FIG. 11, and FIG. 4.

Figure 5:
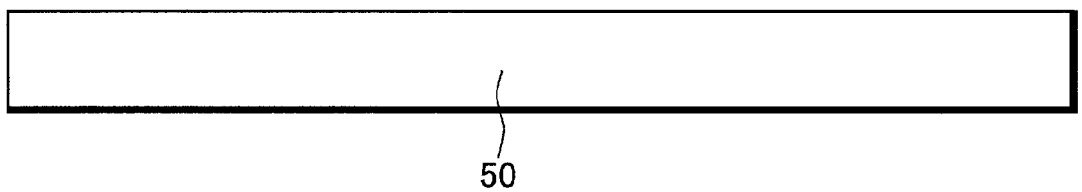
FIG. 5 is a section view describing a first mode for carrying out of a method for manufacturing a protection circuit device using a MOSFET of the invention.

First, as FIG. 5 a sheet-shaped conductive foil 50 is provided. Material of the conductive foil 50 is selected considering fix ability of brazing material, bonding ability, and plating ability. For the material, a conductive foil of Cu as a main material, a conductive foil of Al as a main material, or a conductive foil comprising alloy such as Fe—Ni and so on is used.

Considering later etching, thickness of the conductive foil is 10 μm to 300 μm desirably, here copper foil of 70 μm (2 oz.) is adopted. However the thickness of more than 300 μm or less than 10 μm is fundamentally available. As described later, the thickness is good when the thinner trench 42 than thickness of the conductive foil 50 is formed.

The sheet-shaped conductive foil 50 rolled in roll shape with designated width or the conductive foil cut in designated size may be transferred to each later-mentioned process.

Next, there is a process removing the conductive foil 50 excepting at least area becoming the conductive path 41 thinly than thickness of the conductive foil 50. There is a process covering the trench 42 and with an insulating resin 40 and the conductive foil 50 formed by the removing process.

Figure 6:
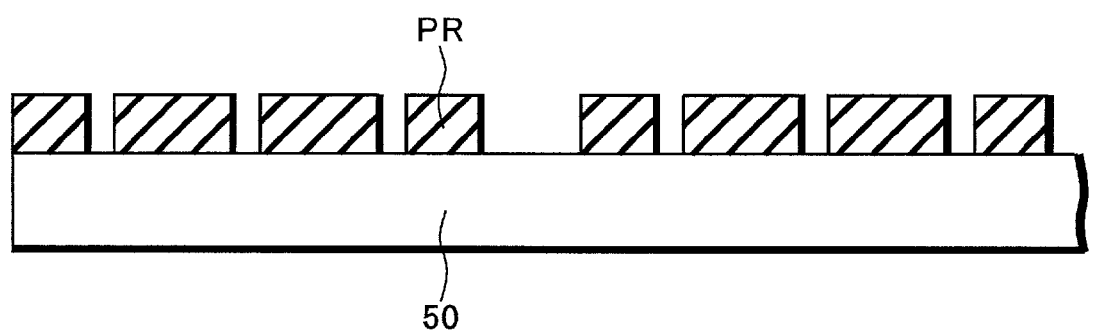
FIG. 6 is a section view describing a first mode for carrying out of a method for manufacturing a protection circuit device using a MOSFET of the invention.
Figure 7:
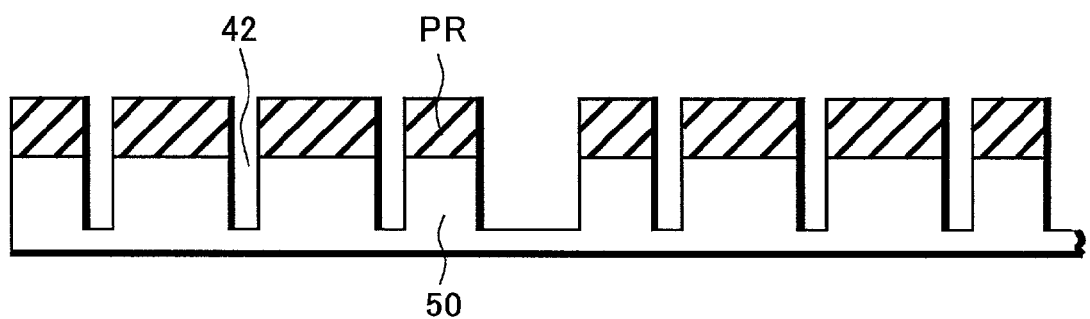
FIG. 7 is a section view describing a first mode for carrying out of a method for manufacturing a protection circuit device using a MOSFET of the invention.
Figure 8:
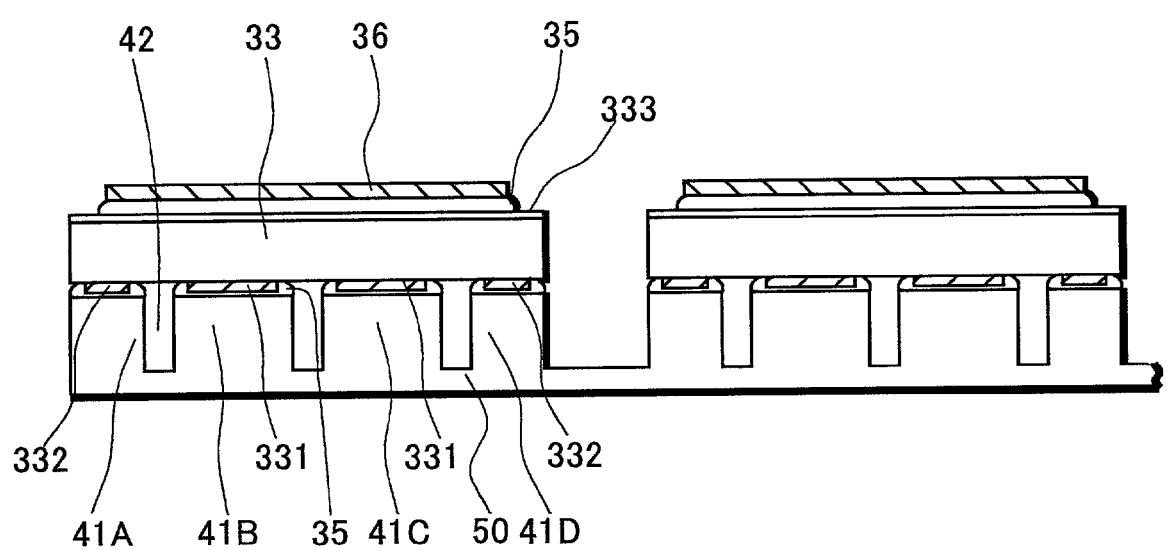
FIG. 8 is a section view describing a first mode for carrying out of a method for manufacturing a protection circuit device using a MOSFET of the invention.

First, a photo resist (etching-resist mask) PR is formed on a Cu foil 50, and is patterned so that the conductive foil 50 excepting at least area becoming the conductive path 41 exposes (Refer FIG. 6 about the above.) The conductive foil is etched through said photo resist PR (Refer FIG. 7 about the above.)

Depth of the trench 42 formed by etching is 50 μm for example, and the side thereof is coarse face so that adhesiveness to the insulating resin 40 is improved.

Although the side wall of the trench 42 is shown in straight schematically, the structure differs depending on method of removing. For the process, wet etching and dry etching are used. In the case of wet etching, for enchant, ferric chloride or cupric chloride is mainly used, and said conductive foil is dipped into the enchant or showered by the enchant. Here, as the conductive foil is generally etched non-anisotropically, the trench 42 of inner part than an opening spreads, and the side face of the trench 42 becomes curved structure being side-etched.

In the case of dry etching, both etchings of anisotropy and non-anisotropy are possible. Although it is said impossible to remove Cu by reactive ion etching, by using sputtering method, Cu can be removed easily. Depending on sputtering condition, both etchings of anisotropy and non-anisotropy can be carried out.

In FIG. 6, a conductive film having etching-tolerant against etching liquid may be selectively covered instead of the photo resist. By selectively covering a part where the conductive path is to be formed with the conductive film, the conductive film acts as an etching protection film and therefore the trench can be formed without using resist. Material for the conductive film is Ag, Au, Pt, or Pd. Moreover the etching-tolerant conductive film can be bonded easily and therefore can be used as die pad and bonding pad alone.

Next, a MOSFET chip 33 is mounted on the conductive path 41 made of the conductive foil 50 separated by the trench 42.

MOSFET chip 33 is a semiconductor bare chip having a source electrode 331 and a gate electrode 332 at front face thereof, and at entire back face, having a drain electrode 333. Pattern recognition is carried out by chip mounting apparatus facing the source electrode 331 and the gate electrode 332 to lower side, and the MOSFET 33 is fixed by flip chip method with brazing material such as solder or the conductive paste 35 contacting the each electrode to the conductive paths 41A and 41B, and 41C and 41D.

A conductive metal board 36 comprising copper is fixed on a drain electrode 333 provide at the back face of the MOSFET chip 33 by brazing material such as solder or the conductive paste 25. As only the drain electrode 333 exist at the back face of the MOSFET chip 33, the conductive metal plate 36 does not short with other electrode. As connection of the conductive metal plate36 and the conductive path 41 is not necessary, it is possible to mount easily with rough positioning using different-shaped parts mounter.

Figure 9:
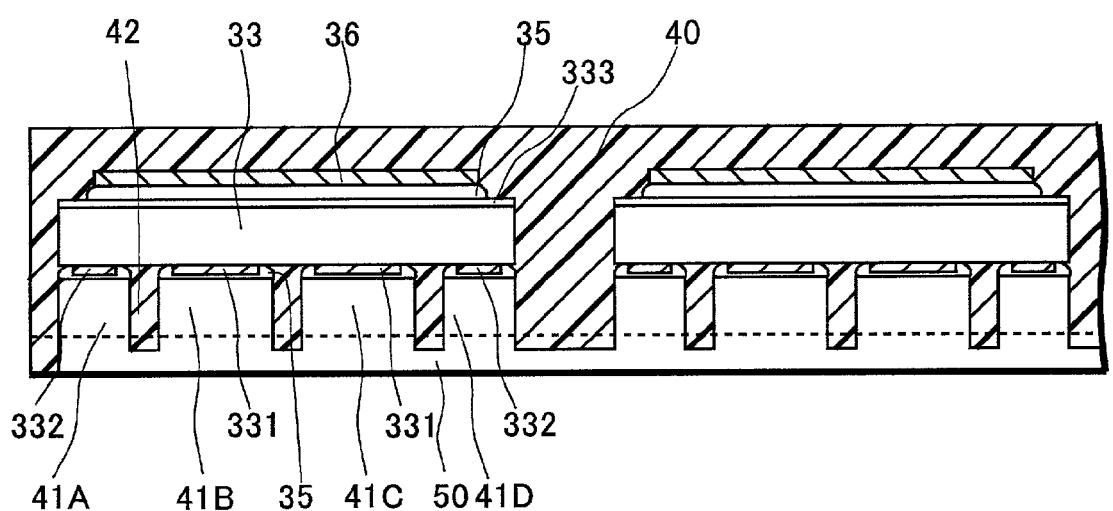
FIG. 9 is a section view describing a first mode for carrying out of a method for manufacturing a protection circuit device using a MOSFET of the invention.

Further as shown in FIG. 9. There is a process fixing the insulating resin 40 on said conductive foil 50 and the trench 42. This is realized by transfer mould, injection mould, or dipping. For the insulating resin 34, thermosetting resin such as epoxy resin is realizes by transfer mould, and thermoplastic resin such as polyimide resin and polyphenylenesulfide is realized by injection mould.

In the mode for carrying out, thickness of the insulating resin 40 covered by surface of the conductive foil 50 is adjusted so as to cover about 100 μm from top portion of the circuit element. It is possible to make thickness thick or thin considering strength.

Characteristic of the process is that the conductive foil 50 becoming the conductive path 41 functions as a supporting board till covering the insulating resin 40. Although the conductive path is formed using the supporting board in the past, the conductive foil 50 functioning as the supporting board is material necessary as electrode material in the invention. Therefore the invention has merit to operate making composition material as few as possible, and can realize reduction of cost.

As the trench 42 is formed thinly than thickness of the conductive foil, the conductive foil 50 is not separated individually as the conductive path 41. Therefore the conductive foil is handled in one body as the sheet-shaped conductive foil 50, and the structure has characteristic that operation of transfer to die and mounting on die is very easy.

Next, there is a process removing the back face of the conductive foil 50 chemically and/or physically and separating as the conductive path 41. Here the process is carried out polishing, grinding, etching, and metal evaporation of laser.

In experiment, entire face is ground about 30 μm by polisher or grinder so that the insulating resin 40 is exposes from the trench 42. The face is shown in FIG. 9 with dotted line. As the result, the conductive path 41 is separated as a conductive path 41 of about 40 μm. After entire face of the conductive foil 50 is wet-etched till just before the insulating resin 40 exposes, entire face may be grounded by polisher or grinder so as to expose the insulating resin 40. Further entire face of the conductive foil 50 is wet-etched till position of dotted line, and the insulating resin 40 may be exposed.

As the result, in the structure, surface of the conductive path 41 exposes on the insulating resin 40. After that, the conductive foil 50 is ground and becomes the trench 42. (Refer FIG. 9 about the above.)

Finally covering conductive material such as solder on the conductive path 41 exposing at the back face of the insulating resin 40, the mounting structure is completed.

In the case of covering the conductive film on the back face of the conductive path 41, the conductive film may be formed previously at the back face of the conductive foil of FIG. 5. In this case, a part corresponding to the conductive path may be covered selectively. Method of covering is plating for example. For the conductive film, material resisting to etching is desirable. In the case of using the conductive film, the conductive path 41 can be separated only by etching without polishing.

Figure 10:
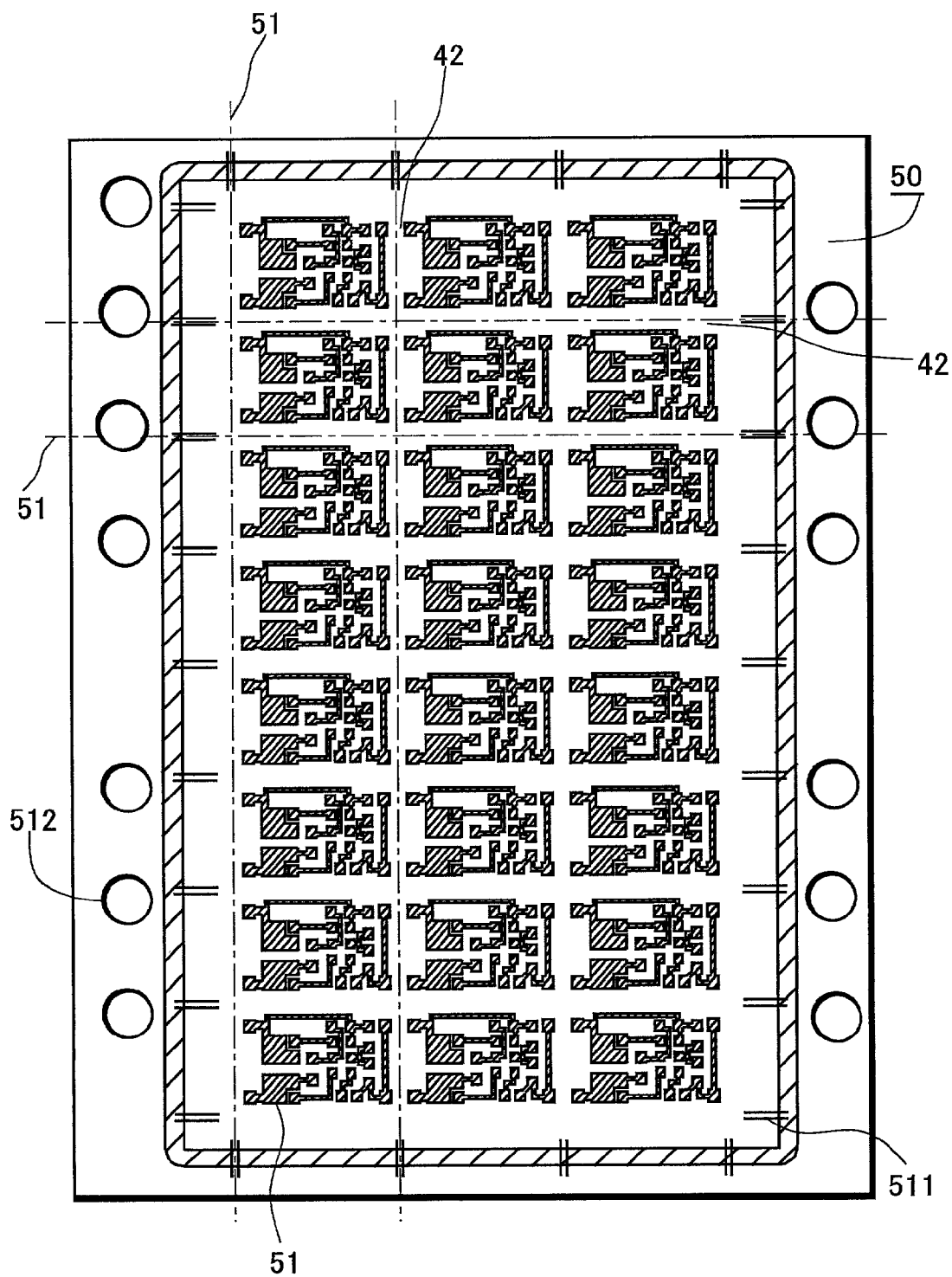
FIG. 10 is a section view describing a first mode for carrying out of a method for manufacturing a protection circuit device using a MOSFET of the invention.

In the above-mentioned description of the method for manufacturing, although MOSFET 33 is described selectively as a circuit part, actually many circuit parts necessary for the protection circuit device of the invention are mounted on the conductive foil 50 shown in FIG. 10 including matrix shape MOSFET 33.

FIG. 10 shows a plan view of a board of the conductive foil 50 after forming the trench 42. The board has size of 45 mm×60 mm, the conductive path 41 is formed at the hatching part, and the separated part 42 is formed at the white part. Therefore part becoming the mounting structure is arranged in matrix shape, 3 row 8 line, and index marks 511 and index holes using in process are provided at periphery thereof. For example, dicing lines are controlled at center of the index marks comprising two lines provided both ends of the board.

Figure 11:
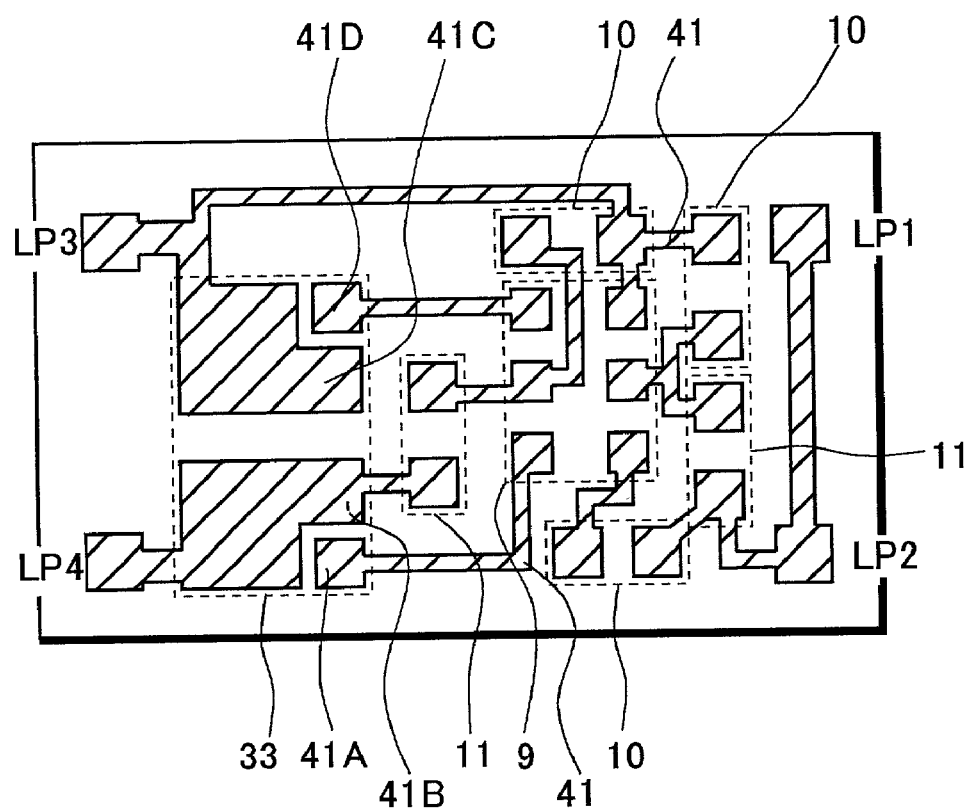
FIG. 11 is an enlarged plan view of the pattern of FIG. 10.

FIG. 11 is an enlarged plan view of a board of one conductive foil 50 of FIG. 10. A MOSFET chip 33 is fixed on conductive paths 41A, 41B, 41C, and 41D shown at left side of the figure by flip chip method. A control IC 9 is fixed to the conductive path 41 at center portion thereof, and at the conductive path 41 of periphery of the IC, chip capacitors corresponding to C1 to C3 of FIG. 19 and chip resistors corresponding to R1 and R2 of the FIG. 19 are fixed using a chip mounter.

External terminals shown at four corners with LP1, LP2, LP3, and LP4 correspond to terminals LP1, LP2, LP3, and LP4 shown in FIG. 19.

Therefore many protection circuit device of the invention formed on the board of the conductive foil 50 shown in FIG. 10 become an individual protection circuit device using MOSFET by cutting at a part of the insulating resin 40 of the trench 42 on dicing line shown with one dot chain line to directions of X axis and Y axis using dicing machine. In such the protection circuit device of the invention, the back face of the conductive path 41 is connected to the conductive path of the printed board by brazing material such as solder in order to use.

By the above-mentioned method for manufacturing, the conductive path 41 is buried in the insulating resin 40 so as to realize the mounting structure of the protection circuit device using flat MOSFET where the back face of the insulating resin 40 and the back face of the conductive path 41.

Characteristic of the method for manufacturing is that operation of separating the conductive path 41 can be carried out using the insulating resin 40 as a supporting board. The insulating resin 40 is a necessary material for material burying the conductive path 41, and the supporting board is not need like the conventional method for manufacturing. Therefore the method has characteristic to manufacture with minimum material and to realize reduction of cost.

Thickness of insulating resin from surface of the conductive path is adjusted at fixing of the insulating resin of front process. As the MOSFET chip 33 is fixed on the conductive path 41 by flip chip method in the invention, bonding wire is excluded. Therefore depending on thickness of the MOSFET chip 33 mounted, the mounting structure has characteristic that thickness thereof is extremely made thin. Here the mounting structure is buried in the insulating resin 40 of about 400 μm thick with the conductive path 41 of 40 μm thick and the MOSFET chip 33 of about 200 μm thick. (Refer FIG. 4 about the above.)

Second mode for carrying out describing a method for manufacturing a protection circuit device using MOSFET Next, a method for manufacturing a mounting structure of a protection circuit device using MOSFET having eaves is described referring FIG. 12 and FIG. 13 to FIG. 17. Except covering a second material 60 becoming eaves, the structure is substantially same as the first mode for carrying out so that concrete description is omitted.

Figure 13:
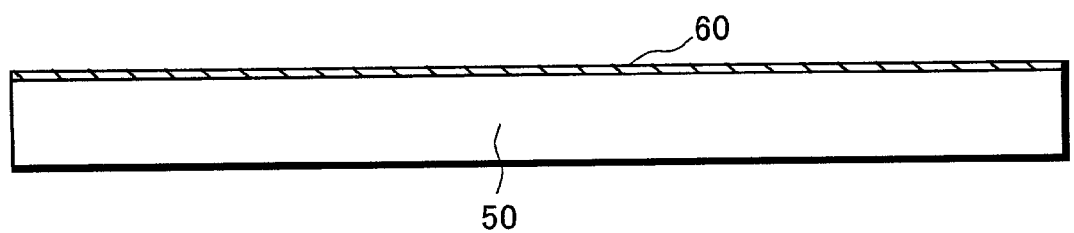
FIG. 13 is a section view describing a second mode for carrying out of a method for manufacturing a protection circuit device using a MOSFET of the invention.
Figure 14:
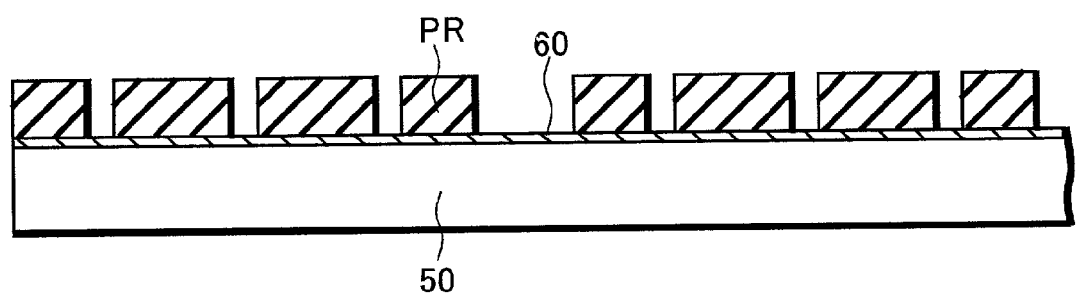
FIG. 14 is a section view describing a second mode for carrying out of a method for manufacturing a protection circuit device using a MOSFET of the invention.
Figure 15:
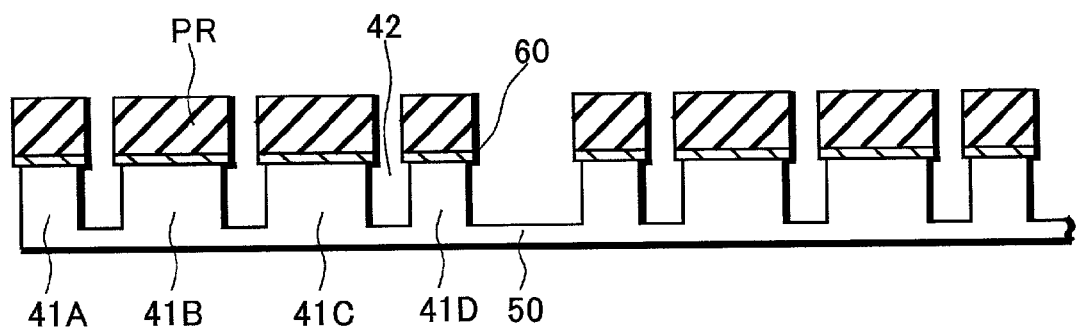
FIG. 15 is a section view describing a second mode for carrying out of a method for manufacturing a protection circuit device using a MOSFET of the invention.
Figure 16:
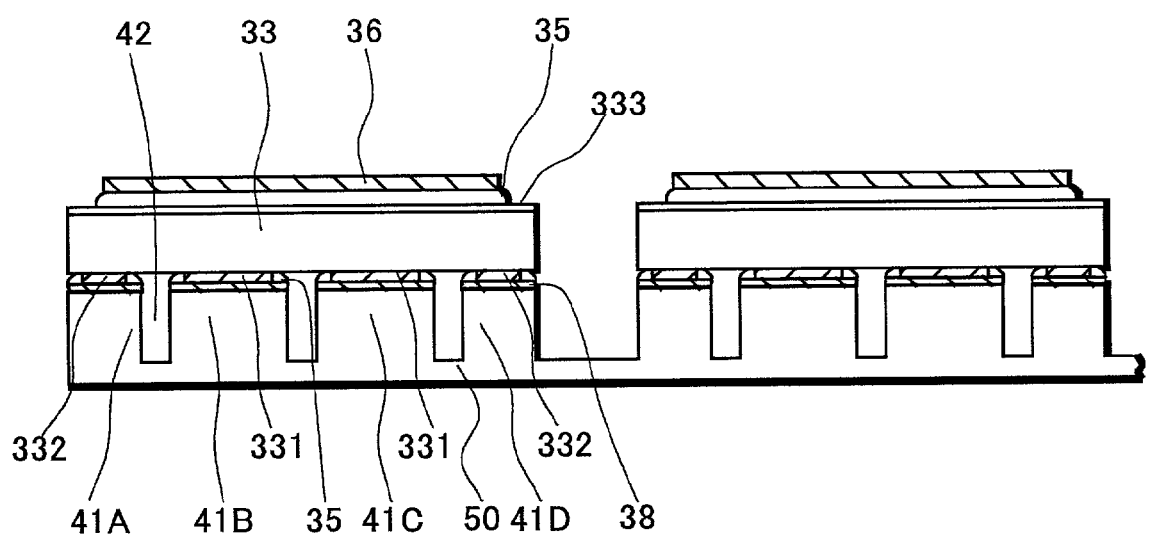
FIG. 16 is a section view describing a second mode for carrying out of a method for manufacturing a protection circuit device using a MOSFET of the invention.
Figure 17:
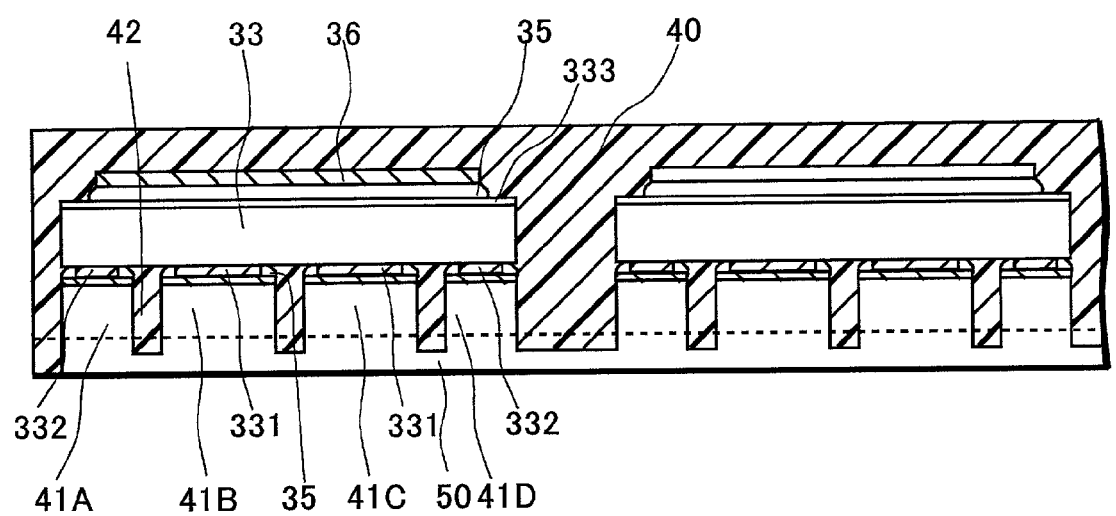
FIG. 17 is a section view describing a second mode for carrying out of a method for manufacturing a protection circuit device using a MOSFET of the invention.

First as shown in FIG. 13, a conductive foil 50 covered on the a conductive foil 50 comprising a first material with the second material 60 which is small in etching rate is provide.

For example when Ni is covered on Cu foil, Cu and Ni are etched at one time by ferric chloride or cupric chloride, and difference of etching rate forms Ni in shape of eaves 38 so that it is suitable. Thick solid line is the conductive film 60 comprising Ni, thickness thereof is desirable to be 1 to 10 μm. The thicker the thickness of the film of Ni, the more easily the eaves is formed.

The second material may cover material selectively etching with the first material. In this case, by patterning a film comprising the second material so as to cover at forming area of a conductive path 41 and by etching a film comprising the first material using the film comprising the second material, eaves 38 is formed. For the second material, Al, Ag, and Au are considered. (Refer FIG. 13 about the above.)

The processes are the following: forming photo resist PR on Ni 60, patterning the photo resist so that Ni except area becoming the conductive path 41 exposes, and etching through said photo resist.

As above-mentioned, when etching is carried out using enchant of ferric chloride and cupric chloride, eaves 38 appears as advance of etching.

The following processes are same as the above-mentioned method for manufacturing: a process mounting the MOSFET 33 on the conductive foil 50 forming said trench 42 (FIG. 16), a process covering said conductive foil 50 and the trench 42 with the insulating resin 40 removing the back face of the conductive foil 40 chemically and/or physically, and separating as the conductive path 41 (FIG. 17), and a process forming the conductive film at the back face of the conductive path to complete (FIG. 12). Therefore the description is omitted.

Further the separating (dicing) step can be performed by forming notches having a predetermined depth in the insulating resin by using a dicing saw, and then separating respectively by using the notches as scribe line.

As clear from the above description, by leading out of the chip to a conductive path on a conductive pattern on circuit board, instead of long wiring (leading) within a chip, the invention consists of minimum elements: the MOSFET chip integrating power MOSFETs Q1 and Q2 in one chip, the conductive path, the conductive metal plate, and the insulating resin. The construction is a mounting structure of protection circuit device using MOSFET useful for resource. Therefore the mounting structure of the protection circuit device using MOSFET not having extra components till completion and reducing cost extremely.

Further, since a conductive path separated by an insulating resin embedded into a trench is used, fine pattern with high accuracy can be obtained and connecting reliability is very high. A thickness of the pattern being the conductive path for a whole thickness of the package, can be made large and therefor wiring resistance can be reduced very much. Therefore MOSFET chip can be mounted directly with flip-chip with high accuracy.

As the MOSFET chip is directly fixed on the conductive path by flip chip method, especially taking-out resistance from the source electrode to the conductive path is removed so as to reduce ON-state resistance 30% comparing with the conventional mounting structure. Connecting common drain electrode of the MOSFET within a chip is not necessary so as to realize extremely simple mounting structure.

In the mounting structure of the protection circuit device using MOSFET of the invention, bonding wire is not need, and by making thickness of film of the insulating resin and thickness of the conductive foil optimum value, height of the structure is made very thin less than 0.5 mm, and at the same time small, light mounting structure is realized.

As only the back face of the conductive path exposes from the insulating resin, the back face of the conductive path instantly connects to outside without using the back face electrode and the through-hole needed in the conventional structure.

As the front face of the trench and the front face of the conductive path of the mounting structure has substantially fitting flat front face and the circuit device itself is moved alone horizontally by surface tension of solder at narrow pitch QFP mounting, correction of lead shift becomes very easy.

Because the second material is formed at front side of the conductive path, bend of the mounting board, particularly bend of long and thin conductive path or peeling off is depressed by difference of coefficient of thermal expansion.

By forming the film comprising the second material on the front face of the conductive path, the eaves covered by the conductive path is formed. Therefore the eaves (visors) can cause anchor effect, and prevent bend of the conductive path and slipping out of the insulating resin.

In the method for manufacturing the protection circuit device using the MOSFET of the invention, the conductive foil itself becoming material of the conductive path functions as the supporting board, the conductive foil supports the whole till forming the trench or mounting of MOSFET and covering the insulating resin. At separating the conductive foil as each conductive path, the insulating resin functions as the supporting board. Therefore the protection circuit device is manufactured by necessary minimum of the MOSFET chip, the conductive foil, the insulating resin. By that the supporting board is not need, the conductive path is buried in the insulating resin, and adjusting thickness of the insulating resin and the conductive foil and bonding wire is not need, a very thin mounting structure of the protection circuit device using MOSFET is realized.

Next, as the conductive path is handled without separating individually till the process removing thinly than thickness of the conductive foil (half-etching for example), many MOSFET chips are manufactured integrating on extremely small board so that operating ability is improved.

As the conductive path and the insulating resin form the same plan, the both are able to shift without touching side face of the conductive path on the mounting board at mounting. Especially in the case that the both are mounted with shifted position, it is possible to re-arrange shifting to horizontal direction. If brazing material is melted after mounting, the device mounted with shift aims to return itself to upper portion by surface tension of melted brazing material so that re-arrangement by the device itself is possible.

What is claimed is:

1. A protection circuit device using MOSFETs comprising:
    a MOSFET chip comprising two MOSFETs to be switched with a control integrated circuit;
    conductive paths of a pattern;
    an insulating board on which the conductive paths are provided;
    a gate electrode and a source electrode of one of the two MOSFETs and a gate electrode and a source electrode of the other MOSFET being symmetrically disposed about a center line of the MOSFET chip, each gate electrode and each source electrode for each of the two MOSFETs being bonded on the respective conductive paths; and
    a conductive material disposed on a common drain electrode provided at a back face of said MOSFET chip.

2. A protection circuit device using MOSFETs according to claim 1, wherein each respective gate electrode and source electrode of each of the two MOSFETs of the MOSFET chip are formed by a gold bump.

3. A protection circuit device using MOSFETs according to claim 1, wherein said conductive material is made of a conductive metal plate or a conductive brazing material.

4. A protection circuit device using MOSFETs comprising:
    a MOSFET chip comprising two MOSFETs to be switched with a control integrated circuit, each of said two MOSFETs having thereunder a respective gate electrode and a respective source electrode;
    conductive paths bonded, respectively, to each of said gate electrodes and each of said source electrodes;
    a common drain electrode disposed on the MOSFET chip;
    a conductive material disposed on the common drain electrode; and
    an insulating resin covering the MOSFET chip provided with the common drain electrode and the conductive material and disposed in a trench that separates the conductive paths, wherein a back face of each of the conductive paths is exposed from the insulating resin.

5. A protection circuit device using MOSFETs according to claim 4, wherein said each gate electrode and each source electrode of the MOSFET chip are arranged symmetrically with respect to a center line of said MOSFET chip.

6. A protection circuit device using MOSFETs according to claim 4, wherein each respective gate electrode and source electrode of each of the two MOSFETs of the MOSFET chip comprises a gold bump.

7. A protection circuit device using MOSFETs according to claim 4, wherein said conductive material is formed by a conductive metal plate or a conductive brazing material.

8. The protection circuit of claim 4, wherein the insulating resin covers all of the sides of the MOSFET chip provided with the common drain region and the conductive paths.

9. The protection circuit of claim 4, wherein the common drain electrode is under the insulating resin.

10. The protection circuit of claim 4, wherein the conductive material is disposed only over the common drain electrode.

11. A protection circuit device using MOSFETs comprising:
    a MOSFET chip comprising two MOSFETs to be switched with a control integrated circuit;
    conductive paths of a pattern;
    an insulating board on which the conductive paths are provided;
    a gate electrode and a source electrode of one of the two MOSFETs and a gate electrode and a source electrode of the other MOSFET being symmetrically disposed about a center line of the MOSFET chip, each gate electrode and each source electrode for each of the two MOSFETs being bonded on the respective conductive paths; and
    a conductive material disposed on a common drain electrode provided at a back face of said MOSFET chip; said conductive material comprising a solder paste disposed over the common drain electrode and a metal plate disposed over the solder paste; and
    an insulating resin covering the MOSFET chip provided with the common drain electrode and the conductive material.

* * * * *